(12) United States Patent
Pu et al.

(10) Patent No.: US 12,243,967 B2
(45) Date of Patent: Mar. 4, 2025

(54) PIXEL PACKAGE AND METHOD OF MAKING THE SAME

(71) Applicants: EPISTAR CORPORATION, Hsinchu (TW); Yenrich Technology Corporation, Hsinchu (TW)

(72) Inventors: Chi-Chih Pu, Hsinchu (TW); Li-Yuan Huang, Hsinchu (TW); Tzu-Hsiang Wang, Hsinchu (TW); Ya-Wen Lin, Hsinchu (TW)

(73) Assignees: Epistar Corporation, Hsinchu (TW); Yenrich Technology Corporation, Hsinchu (TW)

( * ) Notice: Subject to any disclaimer, the term of this patent is extended or adjusted under 35 U.S.C. 154(b) by 631 days.

(21) Appl. No.: 17/565,158

(22) Filed: Dec. 29, 2021

(65) Prior Publication Data
US 2023/0207742 A1    Jun. 29, 2023

(51) Int. Cl.
| | | |
|---|---|---|
| *H01L 33/48* | (2010.01) | |
| *H01L 25/075* | (2006.01) | |
| *H01L 33/38* | (2010.01) | |
| *H01L 33/62* | (2010.01) | |

(52) U.S. Cl.
CPC ........ *H01L 33/483* (2013.01); *H01L 25/0753* (2013.01); *H01L 33/382* (2013.01); *H01L 33/62* (2013.01)

(58) Field of Classification Search
CPC ..... G09F 9/33; H01L 25/0753; H01L 27/156; H01L 33/52; H01L 33/54; H01L 33/58; H01L 33/62
USPC ........................................ 257/211
See application file for complete search history.

(56) References Cited

U.S. PATENT DOCUMENTS

| | | | |
|---|---|---|---|
| 2019/0252585 A1* | 8/2019 | Hsieh | H01L 25/0753 |
| 2020/0194417 A1* | 6/2020 | Yeon | H01L 33/508 |
| 2020/0373469 A1* | 11/2020 | Chen | H01L 33/62 |

FOREIGN PATENT DOCUMENTS

CN    112909205 A  *  6/2021  ......... H10K 50/8428

* cited by examiner

*Primary Examiner* — Fazli Erdem
(74) *Attorney, Agent, or Firm* — Patterson + Sheridan, LLP (57) ABSTRACT

A pixel package includes an electrode structure, a plurality of light-emitting units arranged on the electrode structure, and a light transmitting layer. The electrode structure has an upper layer with a first upper sheet, a lower layer with a first lower sheet, and a supporting layer arranged between the upper layer and the lower layer. The electrode structure and the plurality of light-emitting units are fully embedded in the light transmitting layer. In a top view of the pixel package, the first upper sheet is overlapped with and larger than the first lower sheet.

18 Claims, 9 Drawing Sheets

PIXEL PACKAGE AND METHOD OF MAKING THE SAME

TECHNICAL FIELD

The present disclosure relates to a structure and a method of manufacturing a package, and especially to a structure and a method of manufacturing an LED package used as a display pixel.

DESCRIPTION OF THE RELATED ART

Figure 1A:
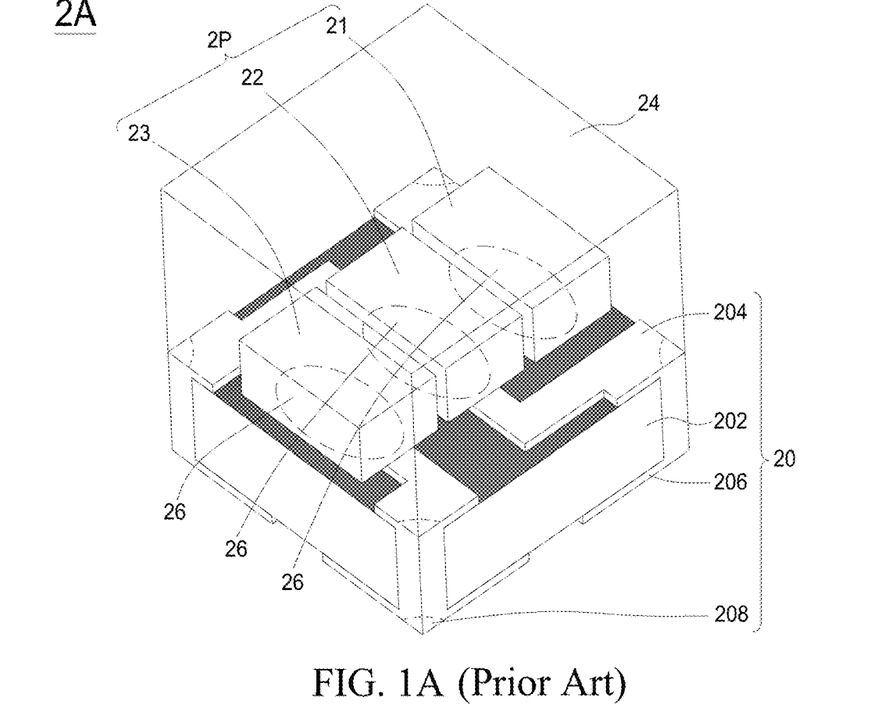
FIGS. 1A and 1B show a perspective view and a top view of a conventional pixel package, respectively.
Figure 1B:
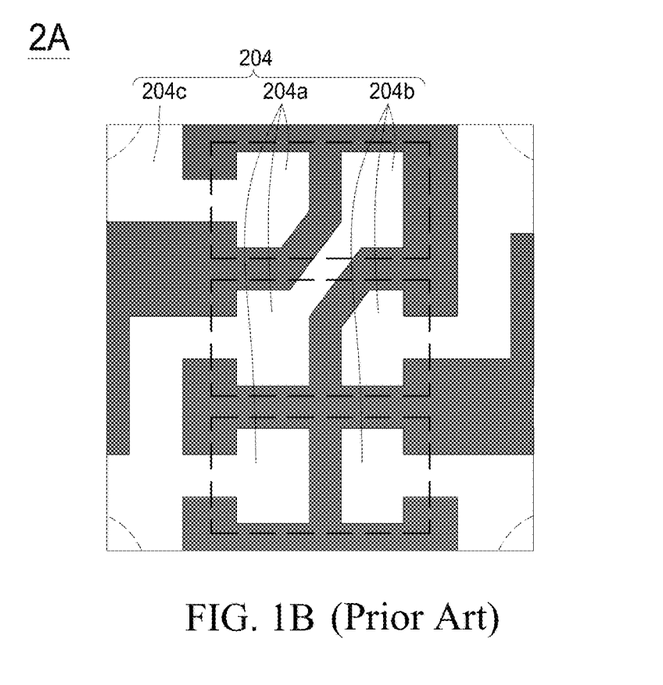

FIG. 1A shows a conventional pixel package 2A including a substrate 20, a pixel unit 2P disposed on the substrate 20, and a light-transmitting layer 24 formed on the substrate 20 and covering the pixel unit 2P. The pixel unit 2P includes a light-emitting unit 21, a light-emitting unit 22 and a light-emitting unit 23, which can emit red light, blue light, and green light, respectively. The substrate 20 comprises an insulating layer 202, an upper conductive layer 204, and a lower conductive layer 206 and a middle conductive layer 208 connecting the upper conductive layer 204 and the lower conductive layer 206. FIG. 1B shows a top view of the substrate 20. The upper conductive layer 204 comprises a conducting portion 204c and three pairs of bonding pads 204a, 204b connecting with the conducting portion 204c. The three pairs of the bonding pads 204a, 204b are used for bonding the light-emitting unit 21~23 and the conducting portion 204c is a designed circuit layout for providing electric current to control the light-emitting unit 21~23. Generally, a width of the conducting portion 204c is smaller than a width of each of the bonding pads 204a, 204b. The width of bonding pads 204a, 204b is preferably larger than 30 µm for bonding the light-emitting unit 21~23, and the conducting portion 204c is supported by the insulating layer 202 and used for conducting electric current and heat dissipation, so the width of the conducting portion 204c can be smaller than 30 µm.

The substrate 20 and the light transmitting layer 24 are usually made of different materials and thus have different physical properties, such as such as CTE, and Tg. When the pixel package 2A is heated, a crack is easily formed between the interface between the substrate 20 and the light transmitting layer 24. The moisture may infiltrate the pixel package 2A from the crack to make the light-emitting unit 21, the light-emitting unit 22 and the light-emitting unit 23 failure.

SUMMARY OF THE DISCLOSURE

The following description illustrates embodiments and together with drawings to provide a further understanding of the disclosure described above.

A pixel package includes an electrode structure, a plurality of light-emitting units arranged on the electrode structure, and a light transmitting layer. The electrode structure has an upper layer with a first upper sheet, a lower layer with a first lower sheet, and a supporting layer arranged between the upper layer and the lower layer. The electrode structure and the plurality of light-emitting units are fully embedded in the light transmitting layer. In a top view of the pixel package, the first upper sheet is overlapped with and larger than the first lower sheet.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

The First Embodiment

Figure 2A:
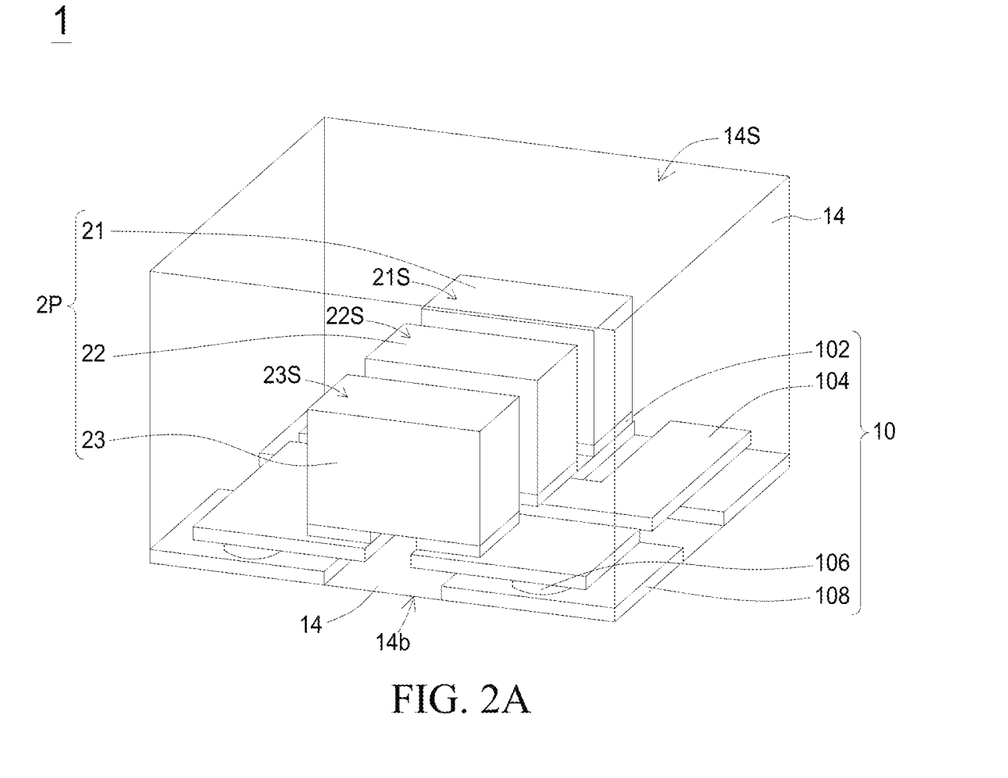
FIGS. 2A, 2B, 2C, and 2D show a structure of a pixel package in accordance with one embodiment of present disclosure.
Figure 2B:
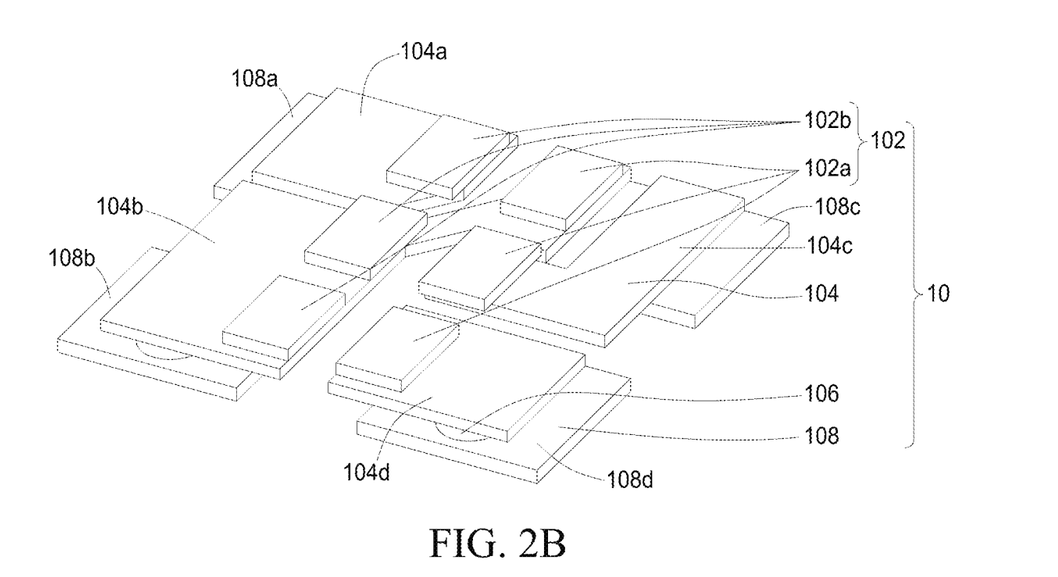
Figure 2C:
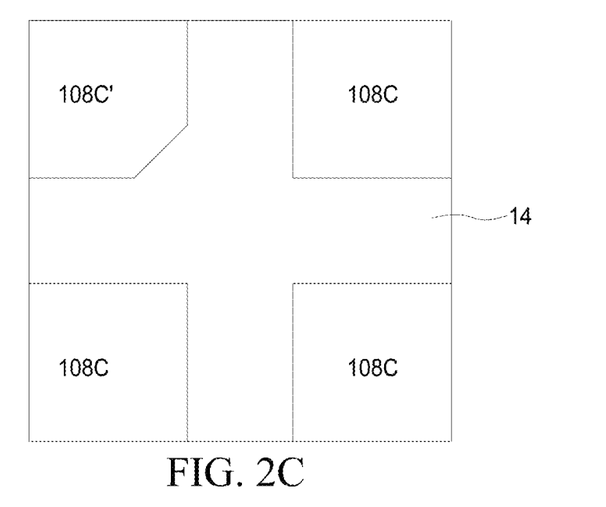

FIGS. 2A~2C show a pixel package 1 in accordance with one embodiment of the present disclosure. FIG. 2A shows a perspective view of the pixel package 1. FIG. 2B shows a perspective view of an electrode structure 10 of the pixel package 1. FIG. 2C shows a bottom view of the pixel package 1.

As shown in FIG. 2A, the pixel package 1 comprises an electrode structure 10, a pixel unit 2P comprising a light-emitting unit 21, a light-emitting unit 22 and a light-emitting unit 23, and a light transmitting layer 14 covering the pixel unit 2P and the electrode structure 10. The light-emitting unit 21, a light-emitting unit 22 and a light-emitting unit 23 are disposed on and electrically connected to the electrode structure 10. The electrode structure 10 and the pixel unit 2P are embedded in the light transmitting layer 14 to expose the lower electrodes 108C and 108C' of the electrode structure 10, as shown in FIG. 2C.

As shown in FIG. 2B, the electrode structure 10 comprises a lower layer 108, a supporting layer 106 on the lower layer 108, an upper layer 104 on the supporting layer 106, and a plurality of electrode pairs 102 on the upper layer 104. In the embodiment, the plurality of electrode pairs 102, the upper layer 104, the supporting layer 106 and the lower layer 108 have the same thickness, which is between 3 µm and 10 µm.

Figure 2D:
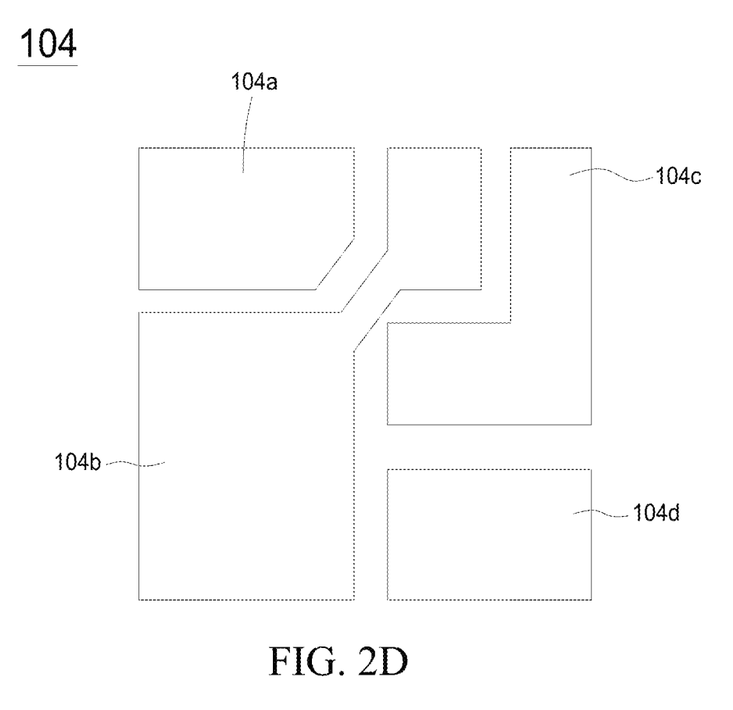

As shown in FIGS. 2B~2D, the upper layer 104 has a plurality of upper sheets 104a, 104b, 104c, 104d, and the lower layer 108 has a plurality of lower sheets 108a, 108b, 108c, 108d. In a top view of the pixel package 1, the upper sheets 104a, 104b, 104c, 104d are separated from each other, and the lower sheets 108a, 108b, 108c, 108d are also separated from each other. FIG. 2D shows a top view of the upper sheets 104a, 104b, 104c, 104d. In one embodiment, the upper layer 104 has four separated upper sheets 104a, 104b, 104c, 104d. As shown in FIG. 2C, the lower layer 108 has four separated cathode(s) and anode(s) which are called and renumbered as lower electrodes 108C and 108C' (the cathode(s) and the anode(s) are called and numbered as the lower sheets 108a, 108b, 108c, 108d in FIG. 2B). Specially, each of the upper sheets 104a, 104b, 104c, 104d and/or each of the lower sheets 108a, 108b, 108c, 108d has a smallest width larger than 30 µm. In the embodiment, in a top view or projection view of the pixel package 1, the total area of the upper layer 104 is larger than the total area of the top surfaces 21S, 22S, 23S of the light-emitting units 21, 22, 23. In one embodiment, in a top view, the total area of the upper layer 104 is larger than 50% of the area of a top surface 14S of the light transmitting layer 14. One of the upper sheets 104a, 104b, 104c, 104d of the upper layer 104 is overlapped with and larger than one of the lower sheets 108a, 108b, 108c, 108d of the lower layer 108. In a top view of the pixel package 1, the total area of the upper layer 104 is larger than the total area of the lower layer 108. The overlapped area of the upper layer 104 and the lower layer 108 is larger than 50% of the total area of the low layer 108. The upper layer 104 and the lower layer 108 have a same quantity of sheets, and in one embodiment, the quantity of the upper sheets 104a, 104b, 104c, 104d or the lower sheets 108a, 108b, 108c, 108d is 4.

Figure 3:
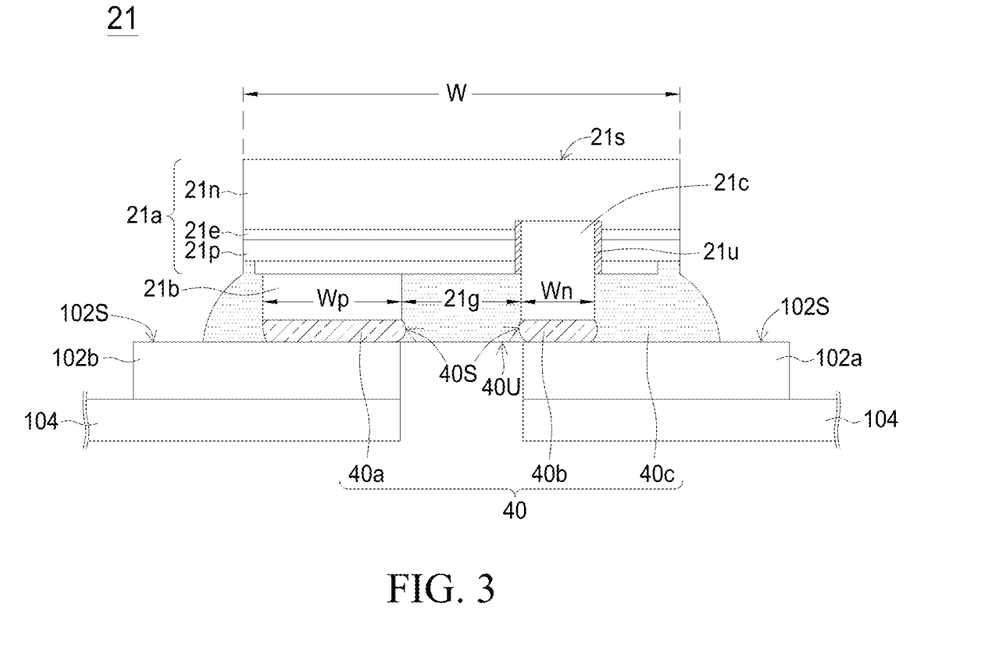
FIG. 3 shows a cross sectional view of the light-emitting unit in accordance with one embodiment of present disclosure.

The upper layer 104 and the lower layer 108 are connected by the supporting layer 106. The supporting layer 106 includes a plurality of metal pillars which directly and electrically connects the plurality of upper sheets 104a, 104b, 104c, 104d of the upper layer 104 and the plurality of lower sheets of the lower layer 108. The diameter of each metal pillars of the supporting layer 106 is larger than 20 µm and smaller than the upper layer 104 and/or the lower layer 108. In a top-view of the electrode structure 10, the supporting layer 106 is covered by the upper layer 104. In comparison with the conventional pixel package 2A shown in FIG. 1A, the sheets of the upper layer 104 and lower layer 108 have larger areas and can effectively sandwich the transmitting layer 14 to form a reinforced structure without relying on an additional supporting substrate, such as the insulating layer 202 shown in FIG. 1A. The lower layer 108, the supporting layer 106, the upper layer 104 and the plurality of electrode pairs 102 can be constructed by metal, such as Cu, Sn, Al, Ag, Au, Ba, Ni or the alloy thereof, or the combination thereof. The supporting layer 106 is arranged in the position to physically and electrically connect the lower layer 108 and the upper layer 104 for conducting electric current between the upper layer 104 and the lower layer 108. In one embodiment, the electrode structure 10 comprises three electrode pairs 102 formed on the upper layer 104 for electrically connecting the respective light-emitting units 21~23, as shown in FIG. 2A. Each electrode pair 102 comprises two bonding pads 102a, 102b. The bonding pads 102a and 102b are physically and electrically separated from each other in a configuration for respectively connecting to an first electrode 21b and a second electrode 21c of the light-emitting units 21~23 by a connecting structure 40, as shown in FIG. 3. The detail of the connecting structure 40 can be referred to FIG. 3 and the corresponding paragraph(s). The connecting structures 40 arranged between the electrode pairs 102 and respective light-emitting unit 21, 22, 23 can be used the same material or different materials. The light-emitting units 21/22/23 are light emitting diodes (LED) or laser diodes. In the embodiment, the light-emitting units 21~23 can emit red light, blue light, and green light, respectively. In other embodiment, the pixel unit 2P comprises four or more light-emitting units, and the electrode structure 10 comprises four or more electrode pairs 102 for connecting the four or more light-emitting units.

FIG. 3 shows the detailed structure of the light-emitting unit 21 and the connecting structure between the bonding pads 102a, 102b and the light-emitting units 21. The light-emitting unit 21 comprises an epitaxial stack 21a, a first electrode 21b and a second electrode 21c. The epitaxial stack 21a comprises a p-type semiconductor layer 21p, an n-type semiconductor layer 21n and an active layer 21e between the p-type semiconductor layer 21p and the n-type semiconductor layer 21n. The first electrode 21b and the second electrode 21c connect the p-type semiconductor layer 21p and the n-type semiconductor layer 21n, respectively, for conducting an electric current into the active layer 21e for emitting light. The second electrode 21c is insulated from the p-type semiconductor layer 21p and the active layer 21e by an insulating layer 21u. The first electrode 21b and the second electrode 21c are separated from each other by a gap 21g. The first electrode 21b and the second electrode 21c have a width Wp and a width Wn, respectively. Generally, the width W of the light-emitting units 21 is between 100 µm and 500 µm, the gap 21g is smaller than 100 µm, and the width Wp and the width Wn are larger than 30 µm for connecting with the bonding pads 102a, 102b firmly. A connecting structure 40 is used for physically connecting each of the light-emitting unit 21~23 and the bonding pads 102a, 102b. The connecting structure 40 comprises a first electrical connecting portion 40a, a second electrical connecting portion 40b and a protective portion 40c. In one embodiment, the first electrical connecting portion 40a physically and electrically connects the bonding pads 102a and the first electrode 21b, and the second electrical connecting portion 40b physically and electrically connects the bonding pads 102b and the second electrode 21c. In one embodiment, each of the first electrical connecting portion 40a and the second electrical connecting portion 40b has an outer surface 40S which is smooth or uneven. The first electrical connecting portion 40a and the second electrical connecting portion 40b are made of electrical conductive material. In one embodiment, in a cross-sectional view, the first electrical connecting portion 40a and/or the second electrical connecting portion 40b is surrounded by the protective portion 40c, and the first electrical connecting portion 40a, the second electrical connecting portion 40b and/or the protective portion 40c has several holes filled with air (not shown). In one embodiment, the number of the holes is smaller than 10, 50 or 100. In another embodiment, the first electrical connecting portion 40a, the second electrical connecting portion 40b and/or the protective portion 40c is devoid of holes. In an embodiment, the protective portion 40c has a bottom surface 40U coplanar with an upper surface of the first electrical connecting portion 40a and the second electrical connecting portion 40b.

The upper layer 104 is used for providing electric current to the bonding pads 102a, 102b. In the embodiment, the upper layer 104 is also used for supporting the bonding pads 102a, 102b and the light-emitting units 21~23 on the bonding pads 102a, 102b, so the area of the upper layer 104 is preferably larger than the area of the bonding pads 102a, 102b, and all of the bonding pads 102a, 102b are overlapped with the upper layer 104.

In the embodiment, the lower layer 108 comprises four separating lower electrodes 108C and 108C'. The lower electrodes 108C, 108C' are overlapped with the upper layer 104 in a projection plane (not shown). In the embodiment, more than 50% of the area of the lower electrodes 108C, 108C' are overlapped with the upper layer 104. The supporting layer 106 comprises a plurality of pillars connecting the upper layer 104 and the lower layer 108. A single pillar has a shape of circle or square.

Figure 4:
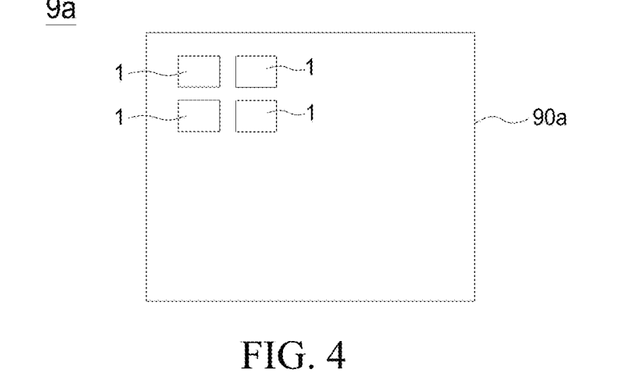
FIG. 4 shows a plurality of the pixel package placed on a circuit board in an array.

The lower electrodes 108C, 108C' expose from the light transmitting layer 14 for connecting to a circuit board 90a (Shown in FIG. 4), such as BT (Bismaleimide-Triazine) circuit board and HDI (High Density Interconnect) circuit board. As shown in FIG. 4, the circuit board 90a is used for interconnecting with an array of the pixel packages 1 to form a display 9a. The four separating lower electrodes 108C, 108C' are used for conducting electric current from the circuit board 90a to control the intensity of color lights from the light-emitting units 21~23 of the pixel package 1. As shown in FIG. 2C, the lower electrode 108C and the lower electrode 108C' have different shapes. In one embodiment, the lower electrodes 108C are anode electrodes, and the lower electrode 108C' is cathode electrode. In other embodiment, the lower electrode 108C' is anode electrodes and the lower electrodes 108C are cathode electrodes.

As shown in FIG. 2A, the light transmitting layer 14 is arranged to cover the pixel unit 2P, the electrode structure 10 and expose the lower electrodes 108C, 108C'. In one embodiment, the top surface 14S of the light transmitting layer 14 is higher than the top surfaces 21S, 22S, 23S of the light-emitting units 21, 22, 23 by a vertical distance between 1~100 μm, or between 10~30 μm. The light transmitting layer 14 is able to protect the light-emitting units 21~23 and the electrode structure 10. Compared with the conventional pixel package 2A shown in FIG. 1A, the pixel package 1 is devoid of an additional supporting substrate and the light-emitting units 21~23 and the electrode structure 10 are embedded in the light transmitting layer 14. The light transmitting 14 is able to prevent the connecting structure 40 from cracking due to thermal expansion and contraction. If the connecting structure 40 cracks, the moisture may intrude into the crack of the connecting structure 40 to make the first electrical connecting portion 40a and second electrical connecting portion 40b open or short.

The transparency of the light transmitting layer 14 is larger than 80% to the light with wavelength between 440 nm~470 nm, 510 nm~540 nm, or/and 610 nm~640 nm, so the light emitted from the light-emitting units 21~23 is able to penetrate the light transmitting layer 14. In one embodiment, the refractive index of the light transmitting layer 14 is between 1.3~2.0. In other embodiment, the refractive index of the light transmitting layer 14 is between 1.35~1.70. The light transmitting layer 14 is made of resin, ceramics, glass or the combination thereof. In one embodiment, the light transmitting layer 14 is made of epoxy or silicone.

Figure 5A:
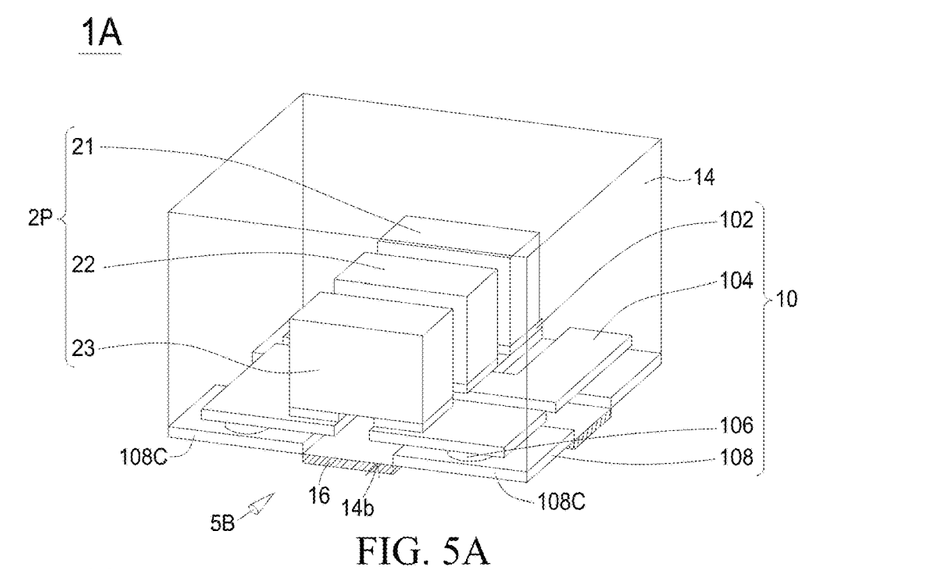
FIGS. 5A and 5B show a perspective view and a side-view of a pixel package in accordance with embodiments of the present disclosure.
Figure 5B:
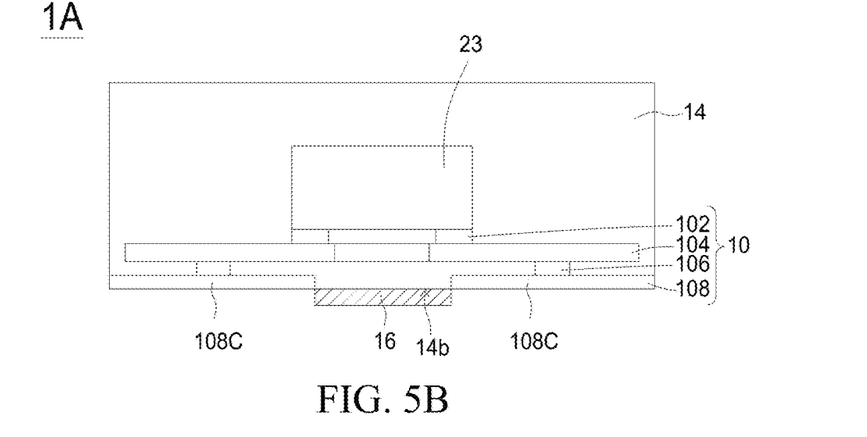

FIGS. 5A~5B show a structure of a pixel package 1A in accordance with one embodiment of the present disclosure. FIG. 5A shows a perspective view of the pixel package 1A, and FIG. 5B shows a side-view of the pixel package 1A. The difference between the pixel package 1A and the pixel package 1 shown in FIG. 2A is that the pixel package 1A has a solder mask 16 formed under the bottom surface 14b of the transmitting layer 14 between the lower electrodes 108C, 108C' and under and contacting the light transmitting layer 14. The solder mask 16 is able to prevent the two adjacent lower electrodes 108C, 108C' from becoming a short circuit during the process of bonding the pixel package 1A on the circuit board 90a. In the embodiment, the solder mask 16 is made of an insulating material, such as polymer.

Figure 6A:
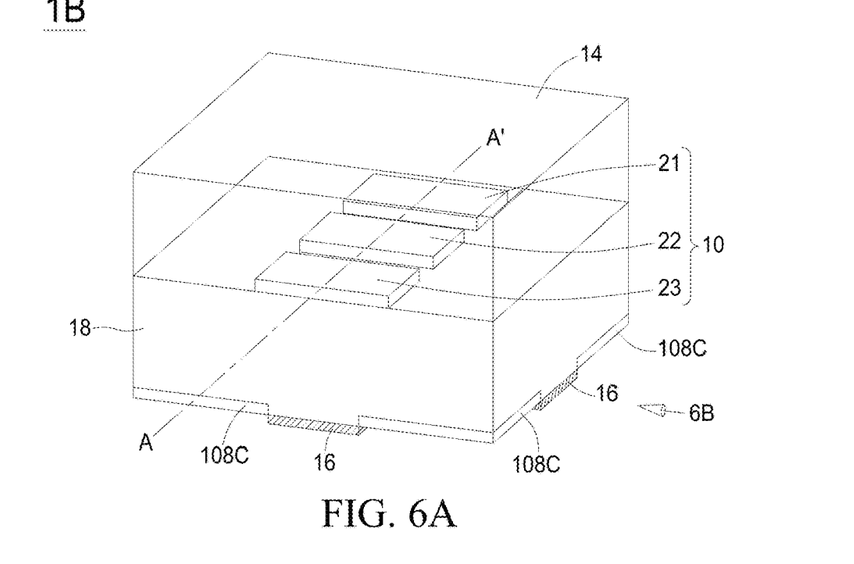
FIGS. 6A and 6B show a perspective view and a side-view of a pixel package in accordance with embodiments of the present disclosure.
Figure 6B:
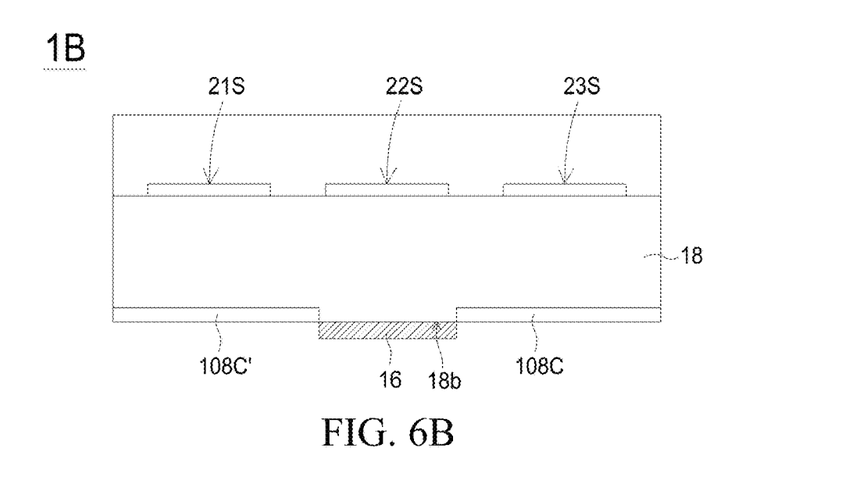

FIGS. 6A~6B show a structure of a pixel package 1B in accordance with one embodiment of the present disclosure. FIG. 6A shows a perspective view of the pixel package 1B, and FIG. 6B shows a side-view of the pixel package 1B of FIG. 6A. The difference between the pixel package 1B and the pixel package 1A shown in FIG. 5A is that the pixel package 1B further comprises a light absorbing layer 18 formed between the solder mask 16 and the light transmitting layer 14. The absorbing layer 18 covers and directly contacts the light-emitting unit 21~23, and exposes the top surface 21S, 22S, 23S of the light-emitting unit 21, 22, 23. The difference between the absorbing layer 18 and the transmitting layer 14 is that the absorbing layer 18 further comprising black material, such as carbon black, so the absorbing layer 18 is black and has a transmittance lower than 5% or 1% to the light from the light-emitting unit 21~23. The absorbing layer 18 is used for improving the contrast of the display.

Figure 7A:
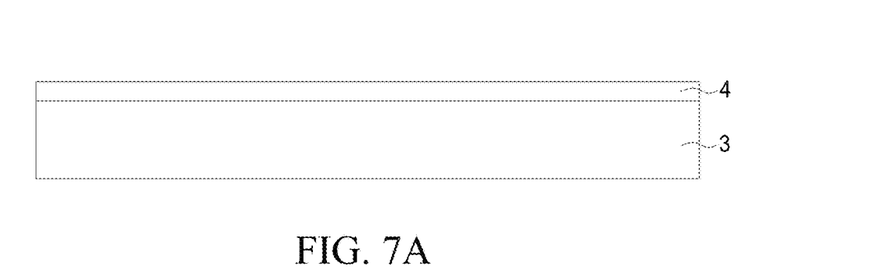
FIGS. 7A, 7B, 7C, 7D, 7E, 7F, and 7G show a process of producing a pixel package.
Figure 7B:
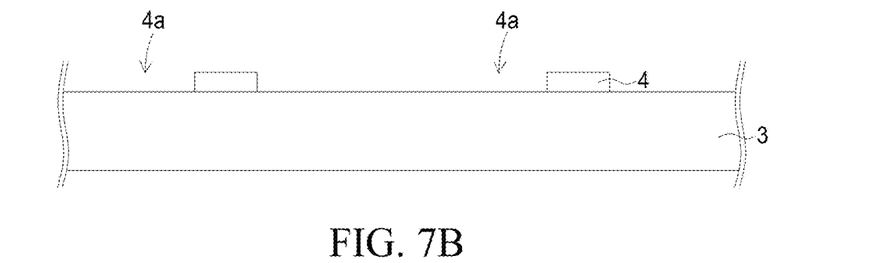
Figure 7C:
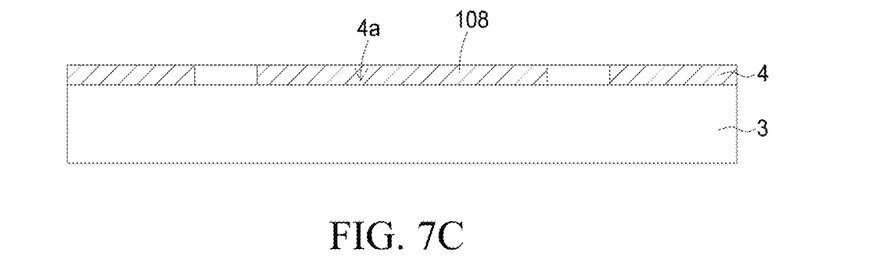
Figure 7D:
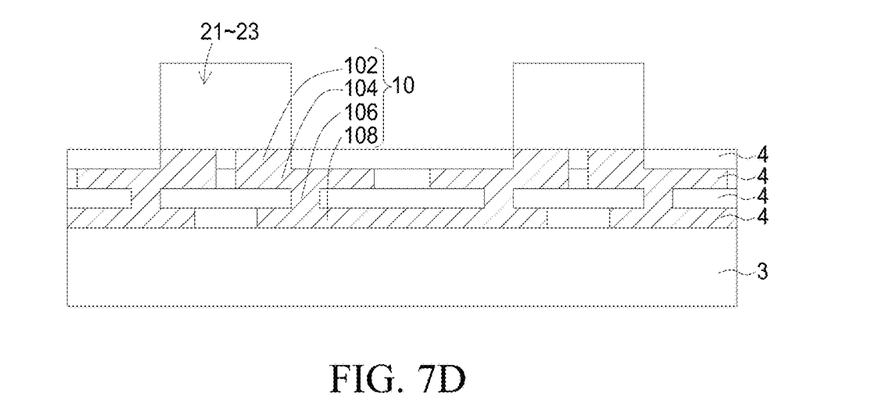
Figure 7E:
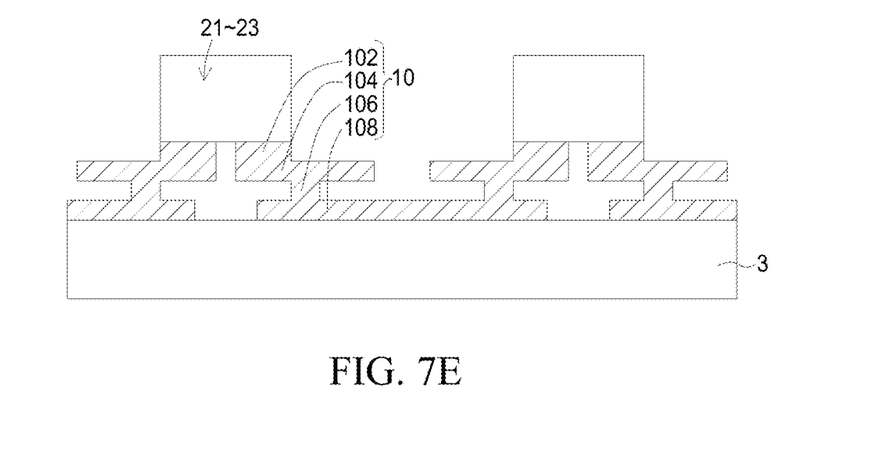
Figure 7F:
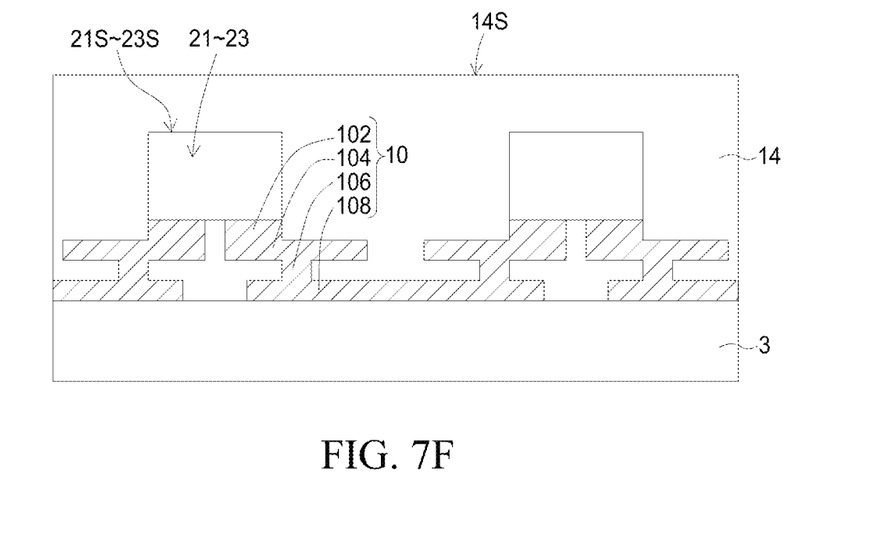
Figure 7G:
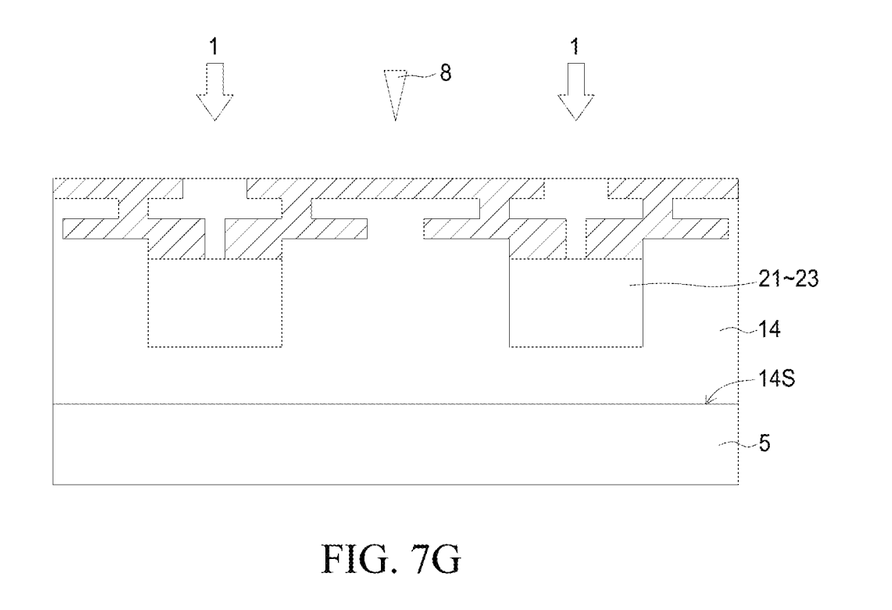

FIGS. 7A~7G show a process of producing the pixel package 1. As shown in FIG. 7A, a supporting substrate 3 is provided and a dry film 4 is provided on the supporting substrate 3, wherein the supporting substrate 3 comprises glass, sapphire or silicon substrate. The dry film 4 is a dry photoresist film, which can be patterned by etching process. As shown in FIG. 7B, a pattern etching process is performed to form a patterned space 4a in the dry film 4. As shown in FIG. 7C, a plating process is performed to form a lower layer 108 in the patterned space 4a. Then, as shown in FIG. 7D, the steps shown in FIGS. 7A~7C are repeated to form the electrode structure 10. And, the light-emitting units 21~23 are provided to be bonded on the plurality of electrode pairs 102. Next, as shown in FIG. 7E, the dry films 4 are removed by an etchant from the supporting substrate 3. Then, as shown in FIG. 7F, a transmitting layer 14 is formed on the supporting substrate 3 to cover the electrode structure 10 and the light-emitting units 21~23. The electrode structure 10 of FIG. 7F is a simplified cross sectional view of the electrode structure 10 of the pixel package 1 shown in FIG. 2A before cutting process. The top surface 14S of the transmitting layer 14 is laid above the top surface 21S, 22S, 23S of the light-emitting unit 21~23. Then, as shown in FIG. 7G, a temporary substrate 5 is provided to be adhered to the top surface 14S of the transmitting layer 14, and the supporting substrate 3 is removed to expose the lower layer 108 of the electrode structure 10. Finally, a cutting process is performed to cut the transmitting layer 14 to form the pixel package 1.

Figure 8:
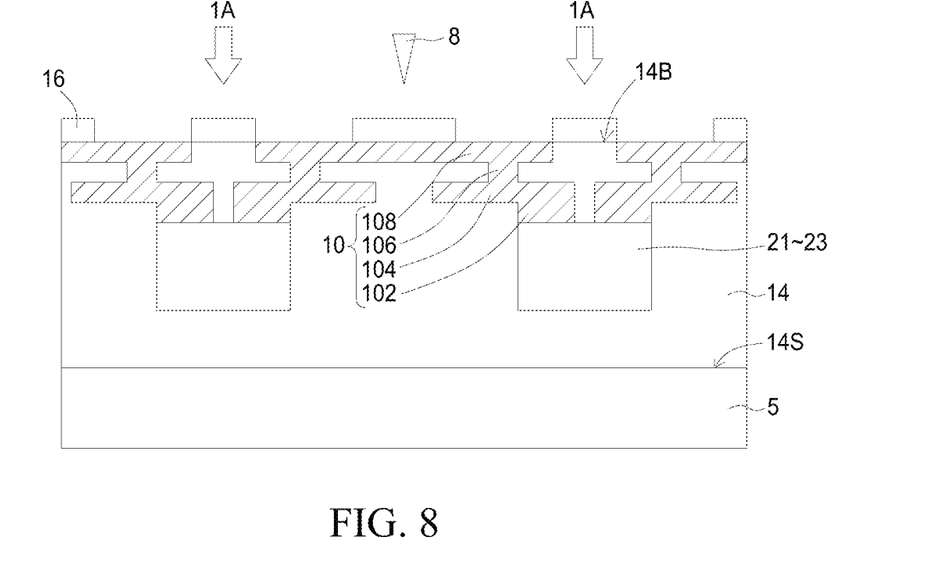
FIG. 8 shows a process of forming a solder mask of the pixel package 1A shown in FIGS. 5A and 5B.

As shown in FIG. 8, before the cutting process, a solder mask 16 is formed on the bottom surface 14B of the transmitting layer 14. Then, a cutting process is performed to cut the solder mask 16 and the transmitting layer 14 to form the pixel package 1A.

Figure 9:
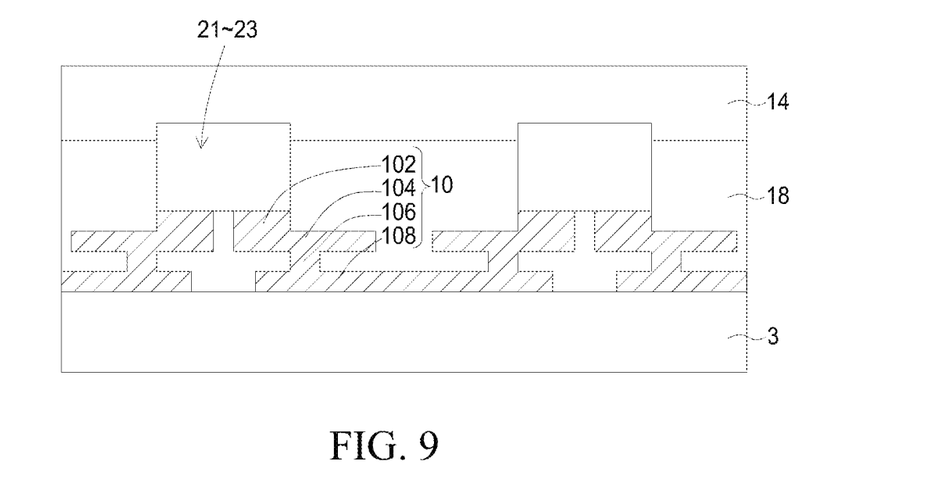
FIG. 9 shows a process of forming a light absorbing layer of the pixel package 1B shown in FIGS. 6A and 6B.

As shown in FIG. 9, before a transmitting layer 14 is formed on the supporting substrate 3, an absorbing layer 18 is formed on the supporting substrate 3 to cover and directly contact the light-emitting unit 21~23 and the electrode structure 10 and expose the top surface 21S, 22S, 23S of the light-emitting unit 21~23. Then, the transmitting layer 14 is formed on the absorbing layer 18 to cover the top surface 21S, 22S, 23S of the light-emitting unit 21~23.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A pixel package, comprising:
   an electrode structure comprising an upper layer with a first upper sheet, a lower layer with a first lower sheet, and a supporting layer arranged between the upper layer and the lower layer;
   a plurality of light-emitting units each arranged on the electrode structure, and having a first top surface; and
   a light transmitting layer having a second top surface located above the first top surface, wherein the electrode structure and the plurality of light-emitting units are fully embedded in the light transmitting layer,
   wherein the upper layer has a total area which is larger than 50% area of the second top surface,
   wherein, in a top view, the first upper sheet is overlapped with and larger than the first lower sheet.

2. The pixel package according to claim 1, wherein, the lower layer has a portion exposed from the light transmitting layer.

3. The pixel package according to claim 1, wherein the upper layer further comprises a second upper sheet.

4. The pixel package according to claim 3, wherein the first upper sheet or the second upper sheet has a smallest width larger than 30 μm.

5. The pixel package according to claim 3, wherein the upper layer and the lower layer have a same quantity of sheet.

6. The pixel package according to claim 1, wherein the supporting layer comprises a plurality of metal pillars electrically and physically connecting the upper later and the lower layer.

7. The pixel package according to claim 6, wherein each of the plurality of metal pillars has a diameter larger than 20 μm.

8. The pixel package according to claim 1, wherein the electrode structure further comprises a plurality of electrode pairs arranged on the upper layer and connected to the plurality of light-emitting units.

9. The pixel package according to claim 8, wherein the plurality of electrode pairs, the upper layer, the lower layer and the supporting layer have a same thickness.

10. The pixel package according to claim 9, wherein the thickness is between 3 μm and 10 μm.

11. The pixel package according to claim 1, wherein the lower layer and the light transmitting layer have bottom surfaces which are coplanar with each other.

12. The pixel package according to claim 11, further comprising a solder mask arranged under the bottom surface of the light transmitting layer without covering the bottom surface of the lower layer.

13. The pixel package according to claim 12, wherein the solder mask comprises an insulating material.

14. The pixel package according to claim 1, wherein the plurality of light-emitting units comprises a light-emitting unit having a width between 100 μm and 500 μm.

15. The pixel package according to claim 1, wherein the plurality of light-emitting units is configured to emit green light, red light or blue light.

16. The pixel package according to claim 1, wherein the second top surface and the first top surface are separated from each other by a vertical distance between 10 μm and 100 μm.

17. The pixel package according to claim 1, wherein, in the top view, the upper layer is larger than a total area of the plurality of light-emitting units.

18. The pixel package according to claim 1, wherein, in the top view, the upper layer is larger than the lower layer.

* * * * *